United States Patent
Nishikawa

(10) Patent No.: US 8,773,111 B2
(45) Date of Patent: Jul. 8, 2014

(54) CURRENT ESTIMATION CIRCUIT

(75) Inventor: Yukihiro Nishikawa, Hino (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 60 days.

(21) Appl. No.: 13/390,100

(22) PCT Filed: Dec. 21, 2010

(86) PCT No.: PCT/JP2010/072985
§ 371 (c)(1), (2), (4) Date: Apr. 20, 2012

(87) PCT Pub. No.: WO2011/104985
PCT Pub. Date: Sep. 1, 2011

(65) Prior Publication Data
US 2012/0313646 A1 Dec. 13, 2012

(30) Foreign Application Priority Data
Feb. 25, 2010 (JP) .................. 2010-040285

(51) Int. Cl.
*G01R 19/00* (2006.01)
*G05F 1/10* (2006.01)

(52) U.S. Cl.
USPC ........ 324/76.11; 324/111; 324/120; 324/127; 324/678; 323/222; 323/282

(58) Field of Classification Search
CPC ...... G01R 31/025; G01R 31/08; G01R 31/40; G01R 27/02; G01R 19/0092; G01R 19/252; G01R 19/18; G01R 1/22; G01R 15/18; G01R 27/2605; G01R 31/25; G01R 31/245; G01R 1/30; G01D 5/24; G01V 1/3808; G06F 17/5036; H01H 47/043; H01H 47/226; H01H 9/56; H05F 3/02; H03K 17/136; H03K 17/0822; H02H 3/08; H02M 1/4225; H02M 2001/0009; H02M 2007/4815; H02M 3/155; H02M 3/28; H02M 5/4585; H02M 7/12
USPC .............. 324/76.11, 111, 120, 126, 127, 678, 324/382, 410, 415, 416, 418; 72/1, 57, 64; 323/222, 282; 363/89
See application file for complete search history.

(56) References Cited

U.S. PATENT DOCUMENTS 7,425,819 B2 * 9/2008 Isobe ............................ 323/222
8,242,755 B2 * 8/2012 Park et al. ..................... 323/222

(Continued)

FOREIGN PATENT DOCUMENTS

JP 09-182416 A 7/1997
JP 2000-032743 A 1/2000

(Continued)

*Primary Examiner* — Huy Q Phan
*Assistant Examiner* — James Split
(74) *Attorney, Agent, or Firm* — Rabin & Berdo, P.C.

(57) ABSTRACT

A current flowing through a switching element (5) of a power supply is detected by an AC current transformer (8), and a capacitor (201) is charged by a voltage corresponding to the current. A reduction factor of the terminal voltage of the capacitor in an off period of the switching element (5) is calculated based on an amplification factor of the terminal voltage of the capacitor, an absolute value of an instantaneous value of an input power supply voltage, and an instantaneous value of a direct current output voltage, and the capacitor is discharged so that the terminal voltage of the capacitor decreases by the reduction factor in an off period of the switching element (5). A current flowing through an inductor (4) is estimated from the terminal voltage of the capacitor.

12 Claims, 11 Drawing Sheets

(56) References Cited

U.S. PATENT DOCUMENTS

| | | | |
|---|---|---|---|
| 8,368,361 B2 * | 2/2013 | Melanson | 323/224 |
| 2011/0311027 A1 * | 12/2011 | Rexhausen et al. | 378/111 |

FOREIGN PATENT DOCUMENTS

| | | |
|---|---|---|
| JP | 2003-348830 A | 12/2003 |
| JP | 2007-209130 A | 8/2007 |

* cited by examiner

US 8,773,111 B2

CURRENT ESTIMATION CIRCUIT

TECHNICAL FIELD

The present invention relates to a current estimation circuit that, in a switching power supply device that converts an alternating current or direct current input power supply voltage into a desired direct current output voltage utilizing an energy accumulation and releasing action of an inductor accompanying a turning on and off of a switching element, estimates a current flowing through the inductor.

BACKGROUND ART

Among switching power supply devices, there are those that detect a current flowing through an inductor, and control an input current or output current. The kind of power factor correction circuit, or the like, that controls an alternating current input current into a sinusoidal waveform and suppress harmonic currents to an alternating current power supply, shown in Patent Document 1, is known as one example thereof.

FIG. 10 is a circuit diagram showing a heretofore known example of a power factor correction circuit that has the same configuration as the power factor correction circuit shown in Patent Document 1. In the heretofore known example, which is a boost chopper type power factor correction circuit, the output of an alternating current power supply 1 is rectified by a full-wave rectifier 3, and the output voltage of the rectifier 3 is applied to a MOSFET 5 via an inductor 4. The inductor 4 accumulates and releases energy in accordance with a turning on and off of the MOSFET 5, and supplies the released energy to a smoothing capacitor 7 via a diode 6. At this time, a voltage corresponding to the current (inductor current) flowing through the inductor 4 is generated at either end of a current detecting resistor 10.

Next, a description will be given of a control circuit 100 that controls the turning on and off of the MOSFET 5 in such a way that the power factor is corrected. The terminal voltage of the smoothing capacitor 7, that is, the direct current output voltage output from the output terminals 2a and 2b, is divided by a voltage dividing circuit formed from resistors 103 and 104. Thereupon, a voltage error amplifier 105 detects an error in the divided voltage with respect to a reference voltage 106, and outputs an error signal indicating the error.

Meanwhile, the output voltage of the rectifier 3, which is a positive voltage, is divided by a voltage dividing circuit formed from resistors 101 and 102. A multiplier 107 executes a calculation whereby the divided voltage is multiplied by the above-mentioned error signal, and outputs the result of the calculation as a current command. A current error amplifier 108 detects an error in the inductor current with respect to the current command, and outputs an error signal indicating the error. Thereupon, a PWM comparator 110 compares the error signal and a carrier signal 109, and outputs a duty ratio gate control signal corresponding to the value of the error signal.

The gate control signal is input into a gate of the MOSFET 5 via a gate driver 111. Consequently, the on-off timing of the MOSFET 5 is controlled in such a way that the inductor current coincides with the current command, as a result of which, the direct current output voltage is controlled so as to become the voltage specified by the reference voltage 106, and an average value of the inductor current is controlled to be a sinusoidal waveform. Although a phase compensation component is provided in each of the voltage error amplifier 105 and current error amplifier 108, these are omitted from FIG. 10. Also, an inverting amplifier circuit for adjusting the polarity and size of a signal input into the inverting input terminal of the current error amplifier 108 is provided between the current detecting resistor 10 and the inverting input terminal of the current error amplifier 108, but this is also omitted.

The heretofore described kind of control is called an average current control, and is advantageous in that there is little distortion in the alternating current input current, even when a discontinuous mode, in which there exists a period in which the inductor current returns to zero every switching cycle, and a continuous mode, in which the inductor current does not return to zero every switching cycle, are mixed.

However, when the inductor current is detected by the current detecting resistor 10 as heretofore described, a problem occurs in that the larger the capacity of the switching power supply device, the greater the power loss of the current detecting resistor 10, and the conversion efficiency decreases. As a countermeasure, it is possible to reduce the power loss by using a DCCT (DC current transformer) incorporating a Hall element, or the like, in place of the current detecting resistor 10, but as the DCCT is comparatively expensive, using it leads to an increase in the cost of the device.

FIG. 11 shows a heretofore known example wherein comparatively low cost ACCTs (AC current transformers) 8 and 8a are used as current detection means. In the heretofore known example, the current flowing through the MOSFET 5 is detected by the ACCT 8, the current flowing through the diode 6 is detected by the ACCT 8a, and these currents are synthesized in a current detector circuit 300a. Consequently, a signal corresponding to the current flowing through the inductor 4 is output from the current detector circuit 300a.

FIG. 12 shows an example of a configuration of the current detector circuit 300a. The current detector circuit 300a includes a voltage limiter formed from Zener diodes 301a and 302a provided between secondary coils of the ACCT 8, a voltage limiter formed from Zener diodes 305a and 306a provided between secondary coils of the ACCT 8a, diodes 303a and 307a that rectify the output signals of the ACCTs 8 and 8a respectively, and a resistor 304a connected between a cathode connection point (signal synthesis point) of the diodes 303a and 307a and a grounding point, wherein a signal voltage corresponding to the current flowing through the inductor 4 is output from the signal synthesis point.

Meanwhile, in Patent Document 2, a technology is described whereby an inductor current of a DC/DC converter is estimated using an ACCT and a charging and discharging of a capacitor.

RELATED ART DOCUMENTS

Patent Documents

Patent Document 1: JP-A-2007-209130 (FIG. 5)
Patent Document 2: JP-A-2003-348830

OUTLINE OF THE INVENTION

Problems that the Invention is to Solve

With the heretofore known example shown in FIG. 11, it is possible to reduce the power loss accompanying the current detection but, as the two ACCTs 8 and 8a are used, problems such as an increase in the number of parts and an increase in part mounting space occur. Furthermore, with the heretofore known circuit, as a surge voltage occurring when the MOSFET 5 is turned off increases due to the effect of the ACCTs 8 and 8a primary side coil inductance and the inductance of wiring connecting the ACCTs 8 and 8a to each other, the switching loss of the MOSFET 5 increases, and there is a danger that as a result, it will not be possible to achieve an object of improving the conversion efficiency.

Meanwhile, the technology described in Patent Document 2 assumes that the inductance value of the inductor is constant. That is, under this kind of assumption, it is possible to calculate the inductor current in an off period with a comparatively high accuracy.

However, there exist kinds of inductor such that the more the current increases, the more the inductance value decreases. For example, inductors such as one that uses a dust core as a core material exhibit a tendency for the inductance value to decrease in accordance with an increase in the current.

Also, the inductance value of the inductor varies in accordance with the direct current amount (DC component), even though the variation range of the current flowing through the inductor is the same, that is, even though the (maximum value−minimum value) of the current is the same, and generally, the larger the direct current amount, the lower the inductance value.

With the technology described in Patent Document 2, as it is not possible to respond to this kind of inductance value variation, it is difficult to stably estimate the current flowing through the inductor.

The invention, having been contrived bearing this kind of situation in mind, has an object of providing a current estimation circuit that can achieve a reduction in cost, a miniaturization, and a suppression of switching loss, and estimate a current flowing through an inductor with a high degree of accuracy, despite a variation in the inductance value of the inductor.

Means for Solving the Problems

The invention is a current estimation circuit, in a switching power supply device that converts an alternating current or direct current input voltage into a direct current output voltage utilizing an energy accumulation and releasing action of an inductor accompanying a turning on and off of a switching element, that estimates a current flowing through the inductor, wherein, in order to achieve the heretofore described object, the circuit includes current detection means that detects a current flowing through the switching element, and outputs a corresponding signal voltage, a capacitor that is charged by a signal voltage from the current detection means, means that calculates an amplification factor of a terminal voltage of the capacitor, instantaneous value detection means that detects an absolute value of an instantaneous value of the input voltage and an instantaneous value of the direct current output voltage, means that calculates a reduction factor of the terminal voltage of the capacitor in an off period of the switching element, based on the amplification factor of the terminal voltage of the capacitor, the absolute value of the instantaneous value of the input voltage, and the instantaneous value of the direct current output voltage, and discharging means that discharges the capacitor so that the terminal voltage of the capacitor decreases in accordance with the reduction factor in an off period of the switching element. According to this configuration, it is possible to estimate the current flowing through the inductor from the terminal voltage of the capacitor.

The current detection means can include a current transformer. Then, for example, an AC current transformer is used as the current transformer.

A discharge prevention circuit that prevents a discharge of current from the capacitor may be provided between the current detection means and the capacitor. The discharge prevention circuit can include a diode that prevents the discharge of current. Also, the discharge prevention circuit may include a switching circuit that is turned on and off at a timing at which the switching element is turned on and off.

For example, a differentiating circuit is used as the means that calculates the amplification factor of the terminal voltage of the capacitor. It is possible to provide the differentiating circuit with a configuration that uses the capacitor as a differential calculating component. The differentiating circuit can have a configuration wherein it has an operational amplifier to an inverting input terminal of which one end of the capacitor is connected, a reference potential is input into a non-inverting input terminal of the operational amplifier, and a resistor is connected between the inverting input terminal and an output terminal of the operational amplifier.

The current estimation circuit can further include voltage selection means that selects whichever of the signal voltage from the current detection means and the terminal voltage of the capacitor is the higher voltage as a voltage that estimates the current flowing through the inductor. Also, the voltage selection means can also select whichever of a corresponding reference voltage when the signal voltage from the current detection means is zero and the terminal voltage of the capacitor is the higher voltage as a voltage that estimates the current flowing through the inductor.

The current estimation circuit can further include voltage selection means that selects whichever of a corresponding reference voltage when the signal voltage from the current detection means is zero and the terminal voltage of the capacitor is the higher voltage as a voltage that estimates the current flowing through the inductor.

Taking the amplification factor of the terminal voltage of the capacitor to be +di/dt, the absolute value of the instantaneous value of the input voltage to be vin, and the instantaneous value of the direct current output voltage to be vo, the reduction factor of the terminal voltage of the capacitor may be obtained by calculating (+di/dt)·(vo−vin)/vin.

Advantage of the Invention

According to the invention, as it is possible to estimate the inductor current in an off period of the switching element using the current flowing through the switching element, there is no need for current detection means that detects the inductor current in the off period. Consequently, it is possible to achieve a reduction in cost and a miniaturization, and it is possible to reduce inductance of wiring relating to the current detection means, thereby suppressing switching loss caused by this wiring inductance.

Furthermore, according to the invention, when the amplification factor of the current flowing through the switching element varies in accordance with a variation of the inductance value of the inductor, the capacitor is discharged by a reduction factor commensurate with the varying amplification factor, meaning that it is possible to accurately estimate the current flowing through the inductor, even when the inductance value varies.

MODE FOR CARRYING OUT THE INVENTION

Figure 1:
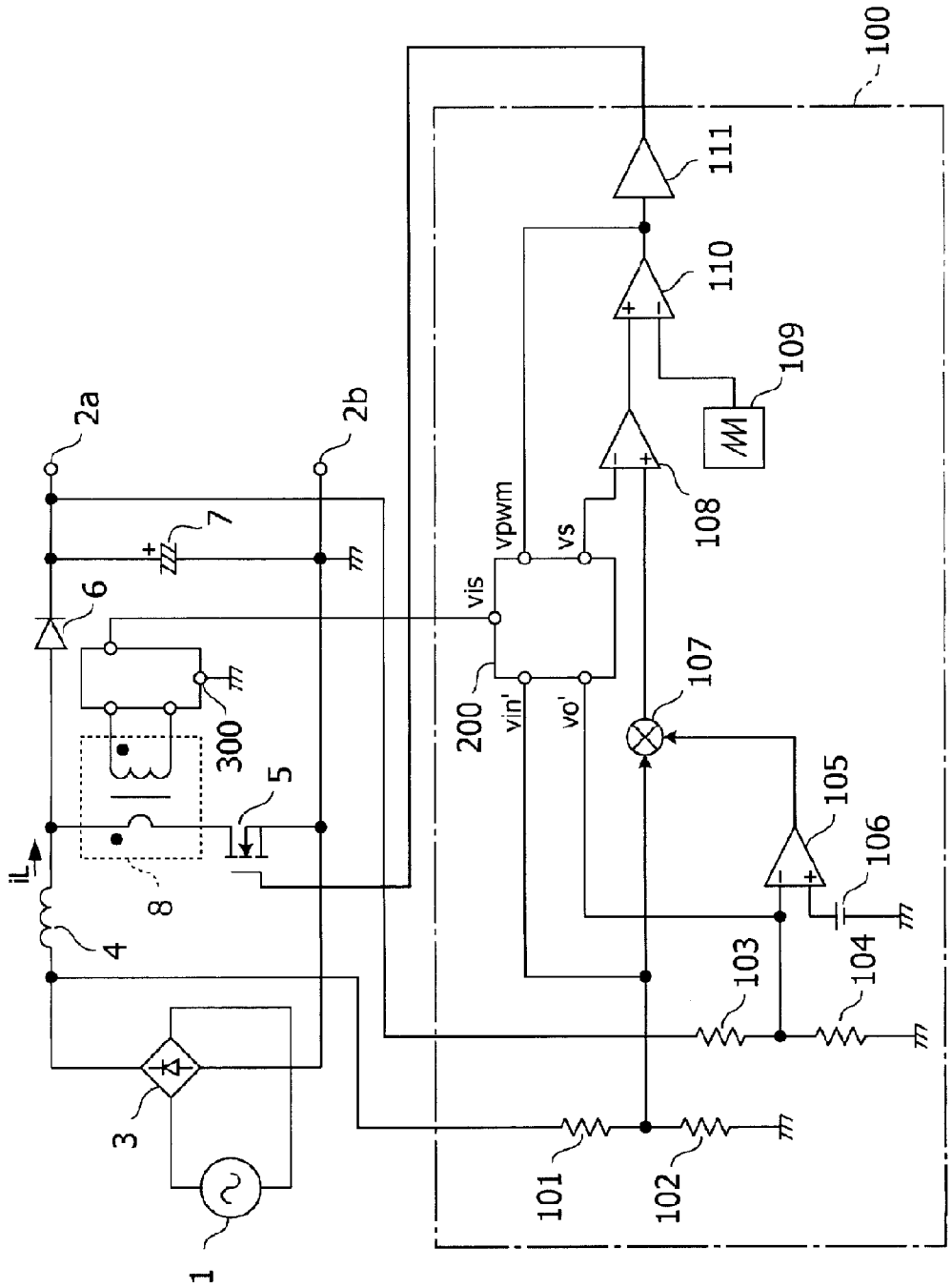
FIG. 1 is a circuit diagram showing an example of a configuration of a switching power supply device to which is applied a current estimation circuit according to the invention.

FIG. 1 is a circuit diagram of a boost chopper type power factor correction circuit shown as an example of a configuration of a switching power supply device to which is applied a current estimation circuit according to the invention. In FIG. 1, the same numbers are given to components the same as, or common to, components shown in FIG. 11. Hereafter, a description of the same or common components will be omitted.

Figure 11:
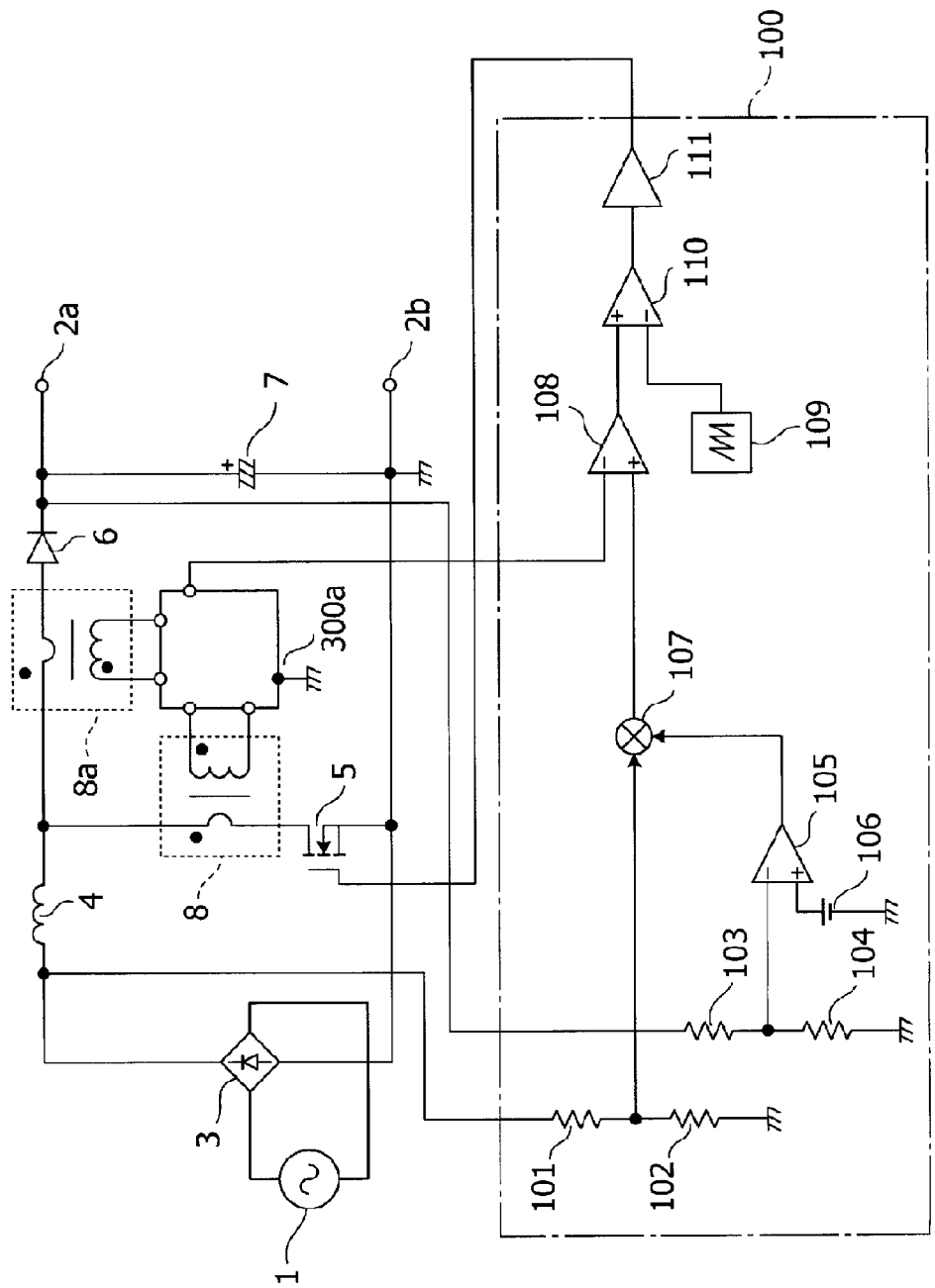
FIG. 11 is a circuit diagram showing a second heretofore known example.
Figure 12:
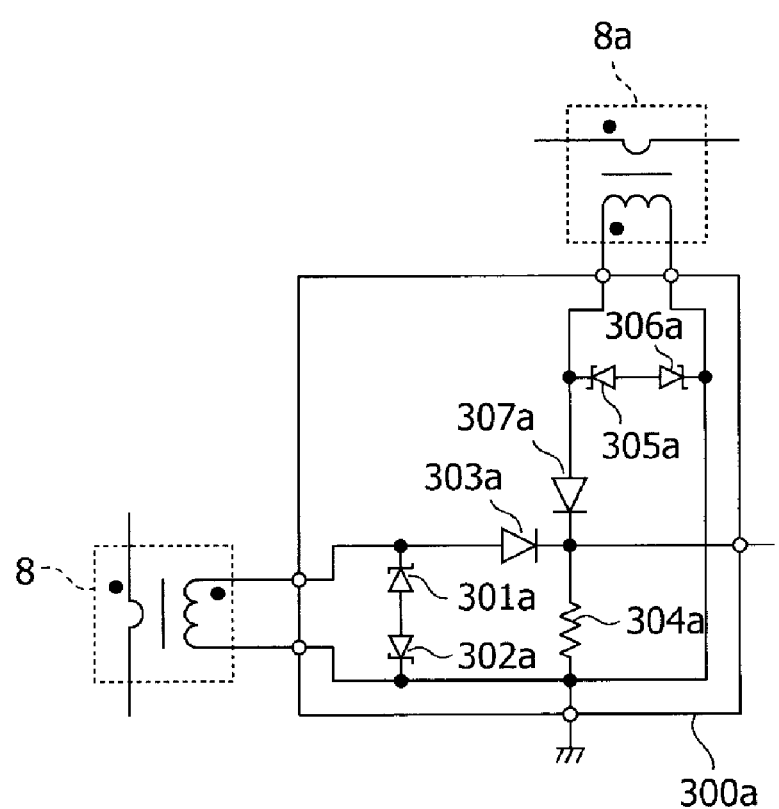
FIG. 12 is a circuit diagram showing a specific example of the current detector circuit in the heretofore known example of FIG. 11.

In a heretofore known example shown in FIG. 11, a current flowing through a diode 6, that is, a current flowing through an inductor 4 during an off period of a MOSFET 5, is detected by an ACCT 8a, which is an AC current transformer. In an embodiment of the invention, however, as inductance in the off period is estimated by a current estimation circuit 200, shown in FIG. 1, added to a control circuit 100, the ACCT 8a is omitted.

Figure 2:
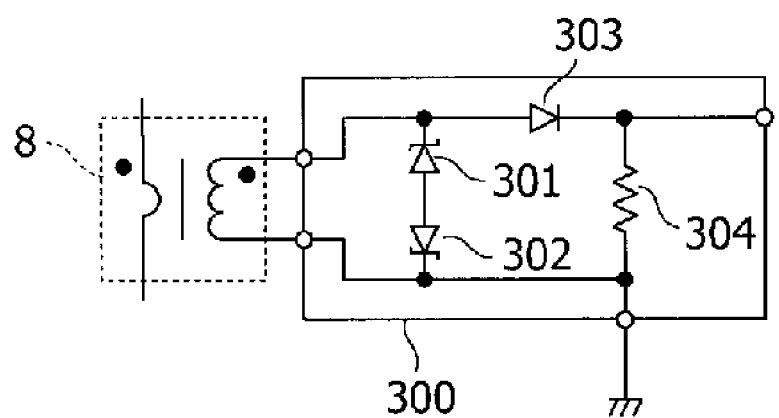
FIG. 2 is a circuit diagram showing a specific example of a current detector circuit.

Firstly, referring to FIG. 2, a description will be given of a specific example of a current detector circuit 300 connected to an ACCT 8. The current detector circuit 300 includes a voltage limiter formed from Zener diodes 301 and 302 connected in series between secondary coils of the ACCT 8, a diode 303 that rectifies an output signal of the ACCT 8, and a resistor 304 connected between a cathode of the diode 303 and a grounding point. A signal corresponding to a current flowing through the inductor 4 in an on period of the MOSFET 5 is output from the current detector circuit 300. The above-mentioned voltage limiter is provided in order to make an exciting current that excites an iron core of the ACCT 8 practically zero in an off period of the MOSFET 5.

Next, referring to FIG. 3, a description will be given of a specific example of the current estimation circuit 200. The current estimation circuit 200 includes a discharge prevention circuit 400 including an operational amplifier 401 and diode 402, a capacitor 201 connected between an output terminal of the discharge prevention circuit 400 and a grounding point, a differentiating circuit 500 that differentiates a terminal voltage of the capacitor 201, a sample and hold circuit 202 that holds an output signal value of the differentiating circuit 500, a multiplier 203 that multiplies an output of the sample and hold circuit 202 by an output of a divider 206, and a voltage controlled current source 204 controlled by an output of the multiplier 203. Herein, the discharge prevention circuit 400 outputs a voltage equivalent to that input by functioning as a voltage follower, and performs a function of preventing the charge of the capacitor 201 from being discharged on the discharge prevention circuit 400 and current detector circuit 300 side, that is, preventing the charge of the capacitor 201 from being discharged via the output terminal of the operational amplifier 401, using the diode 402.

Herein, when taking an absolute value of an instantaneous value of the input voltage (the output voltage of a rectifier 3 in the embodiment of FIG. 1) to be vin, an instantaneous value of a direct current output voltage output from terminals 2a and 2b to be vo, an inductance value of the inductor 4 to be L, and a current amplification factor of a current flowing through the inductor 4 in a period in which the MOSFET 5 is on to be (+di/dt), the current amplification factor is expressed as in the following Equation (1).

$$+di/dt = vin/L \quad (1)$$

Also, when taking a reduction factor of a current flowing through the inductor 4 in a period in which the MOSFET 5 is off to be (−di/dt), the current reduction factor is expressed as in the following Equation (2).

$$-di/dt = (vo-vin)/L \quad (2)$$

When L is deleted from Equations (1) and (2), the following Equation (3) is obtained.

$$-di/dt = \{(vo-vin)/vin\} \times (+di/dt) \quad (3)$$

As is clear from Equation (3), the current reduction factor (−di/dt) can be obtained by multiplying the current amplification factor (+di/dt) by the proportional factor (vo−vin)/vin.

Meanwhile, a divided voltage having a voltage value vin' corresponding to the instantaneous value vin of the input voltage is output from a voltage divider circuit formed from a resistor 101 and resistor 102 shown in FIG. 1, and also, a divided voltage having a voltage value vo' corresponding to the instantaneous value vo of the direct current output voltage is output from a voltage divider circuit formed from a resistor 103 and resistor 104 shown in FIG. 1.

In the embodiment, values of the resistors 101 to 104 are set so that the divided voltage ratios of the two voltage divider circuits are equal. Consequently, the relationship of the following Equation (4) is established between the proportional factor (vo−vin) of Equation (3) and the output voltage values vin' and vo' of the voltage divider circuits.

$$(vo-vin)/vin = (vo'-vin')/vin' \quad (4)$$

Figure 3:
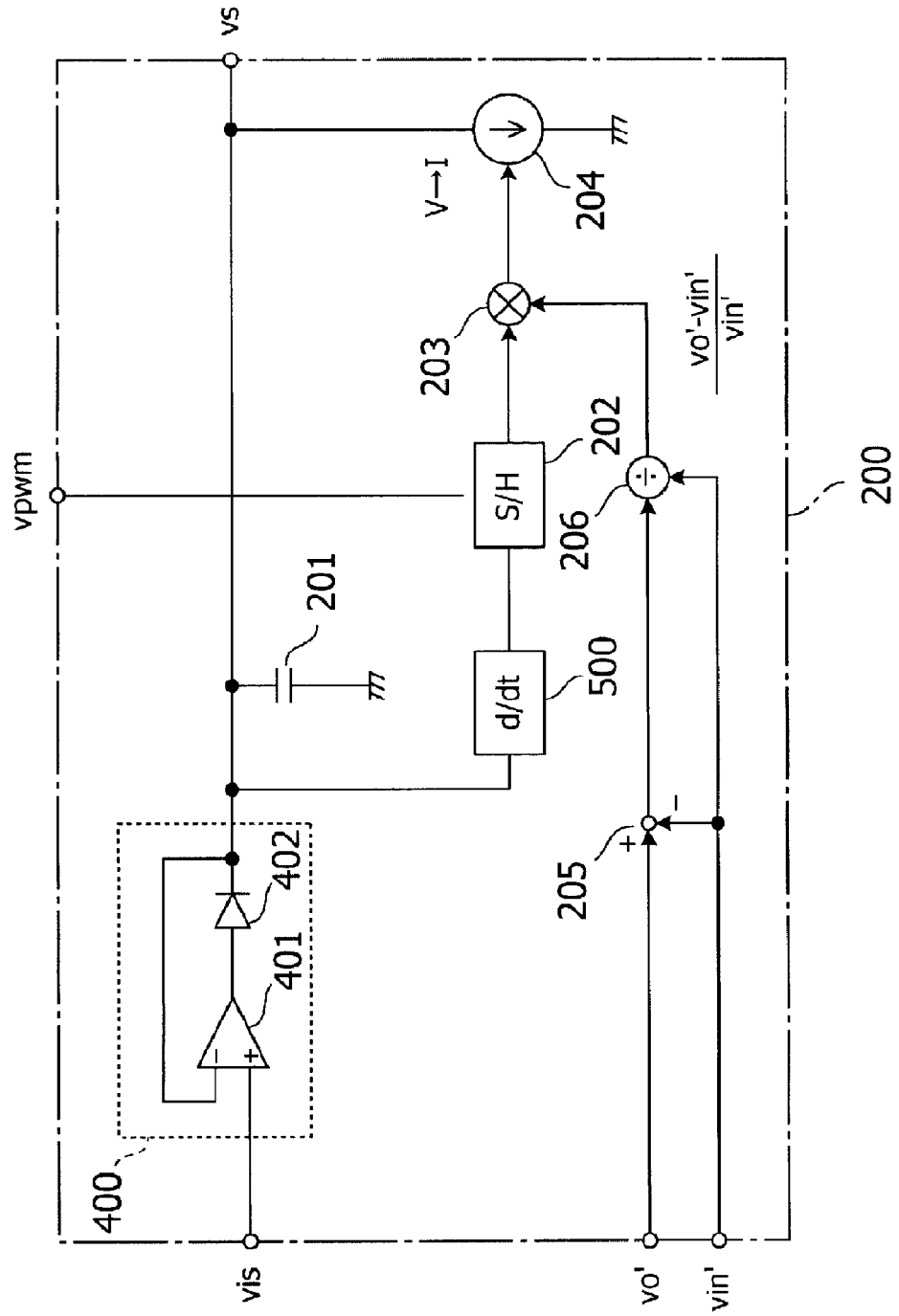
FIG. 3 is a circuit diagram showing a specific example of the current estimation circuit.

Meanwhile, an output voltage vis of the current detector circuit 300 shown in FIG. 1 is input into the discharge prevention circuit 400 shown in FIG. 3. Consequently, the capacitor 201 of FIG. 3 is charged by a voltage having a waveform the same as the waveform of the output voltage vis of the current detector circuit 300 in a period in which the MOSFET 5 is on. At this time, a peak value of the terminal voltage of the capacitor 201 corresponds to an initial value of a current flowing through the inductor 4 when the MOSFET 5 is turned off.

The differentiating circuit 500 differentiates a terminal voltage value vs of the capacitor 201, and outputs a signal indicating the current amplification factor (+di/dt) of the current flowing through the inductor 4 in a period in which the MOSFET 5 is on. The sample and hold circuit 202 reads the value of the current amplification factor (+di/dt) based on an output signal vpwm of a PWM comparator 110, shown in FIG. 1, that specifies a period for which the MOSFET 5 is on, and holds the value for a period for which the MOSFET 5 is off.

Meanwhile, a calculation (vo'−vin') whereby the voltage value vin' corresponding to the instantaneous value yin is subtracted from the voltage value vo' corresponding to the instantaneous value vo is executed in a subtractor 205, and also, a calculation (vo'−vin')/vin' whereby the result of the subtraction (vo'−vin') is divided by the voltage value vin' is executed in the divider 206. As is clear from Equation (4), the proportional factor (vo−vin)/vin is obtained from the calculation in the divider 206.

The calculation of Equation (3), whereby the value of the current amplification factor (+di/dt) held in the sample and hold circuit 202 is multiplied by the proportional factor (vo−vin)/vin, is executed in the multiplier 203, by which the reduction factor (−di/dt) of the current flowing through the inductor 4 in a period in which the MOSFET 5 is off is obtained.

The voltage controlled current source 204 discharges the capacitor 201 in accordance with the reduction factor (−di/dt) in an off period of the MOSFET 5. Because of this, the reduction factor of the terminal voltage value vs of the capacitor 201 coincides with the reduction factor of the current flowing through the inductor 4 in an off period of the MOSFET 5.

That is, the terminal voltage value vs of the capacitor 201 increases by an amplification factor in accordance with the current amplification factor (+di/dt) in an on period of the MOSFET 5, and decreases by a reduction factor in accordance with the current reduction factor (−di/dt) in an off period of the MOSFET 5.

In this way, according to the embodiment, as the terminal voltage value vs of the capacitor 201 corresponds to the current flowing through the inductor 4, it is possible to estimate the current flowing through the inductor 4 in an off period of the MOSFET 5 from the terminal voltage value vs of the capacitor 201, despite not using the ACCT 8a shown in FIG. 11.

Figure 4A:
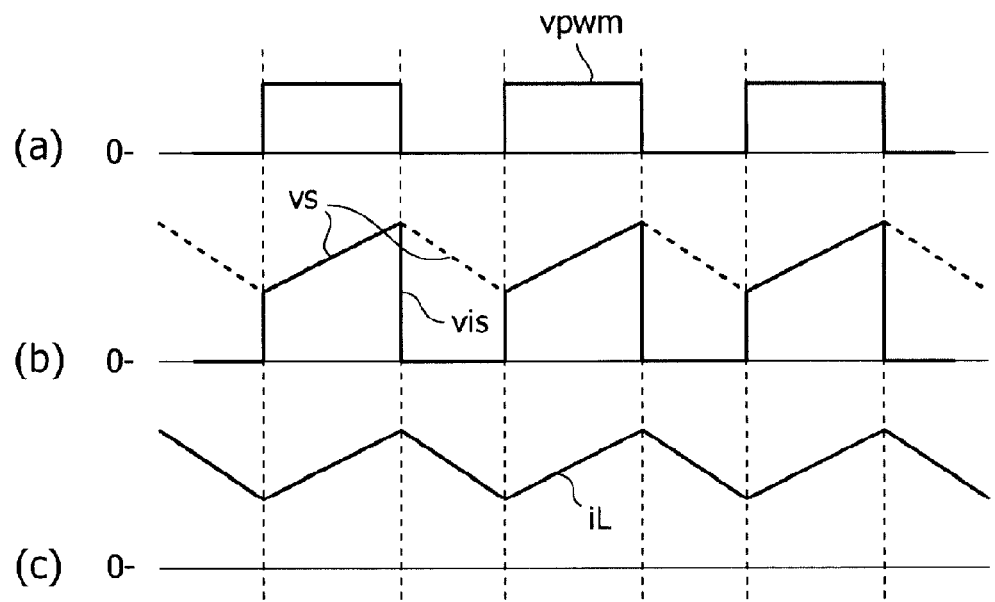
FIG. 4 (A) shows a waveform diagram for illustrating an action of the current estimation circuit of FIG. 3 in a continuous mode, while (B) shows a waveform diagram for illustrating an action of the same circuit in an intermittent mode.
Figure 4B:
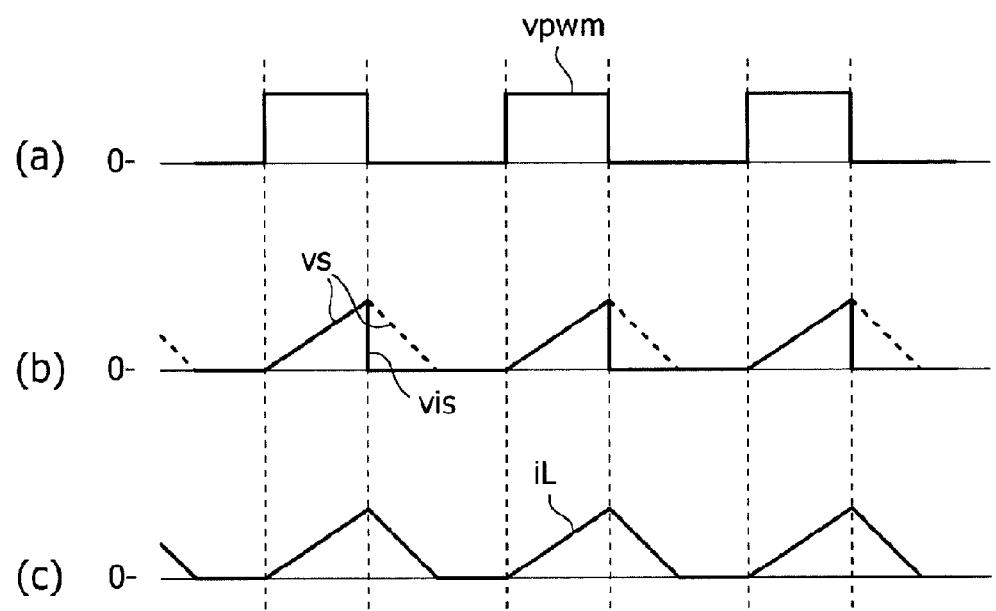

FIG. 4 (A) shows a waveform diagram for illustrating an action of the current estimation circuit 200 in a continuous mode (a mode in which the inductor current does not return to zero every switching cycle), while FIG. 4 (B) shows a waveform diagram for illustrating an action of the same circuit 200 in an intermittent mode (a mode in which the inductor current returns to zero every switching cycle).

In the diagrams, (a) exemplifies the waveform of the output signal vpwm of the PWM comparator 110 (refer to FIG. 1) that specifies an on period and off period of the MOSFET 5, (b) the waveform (refer to the solid lines) of the terminal voltage of the capacitor 201 in an on period of the MOSFET 5 and the waveform (refer to the dotted lines) of the terminal voltage of the capacitor 201 in an off period of the MOSFET 5, and (c) the waveform of the current flowing through the inductor 4.

As is clear from FIG. 4, as the terminal voltage vs of the capacitor 201 increases and decreases in the same pattern as an inductor current iL, the terminal voltage vs corresponds to the inductor current iL. Therefore, in the embodiment, the value of the inductor current iL is estimated from the value of the terminal voltage vs of the capacitor 201 output from the current estimation circuit 200. The terminal voltage vs of the capacitor 201 corresponding to the inductor current iL is input into the error amplifier 108, as shown in FIG. 1.

Figure 5:
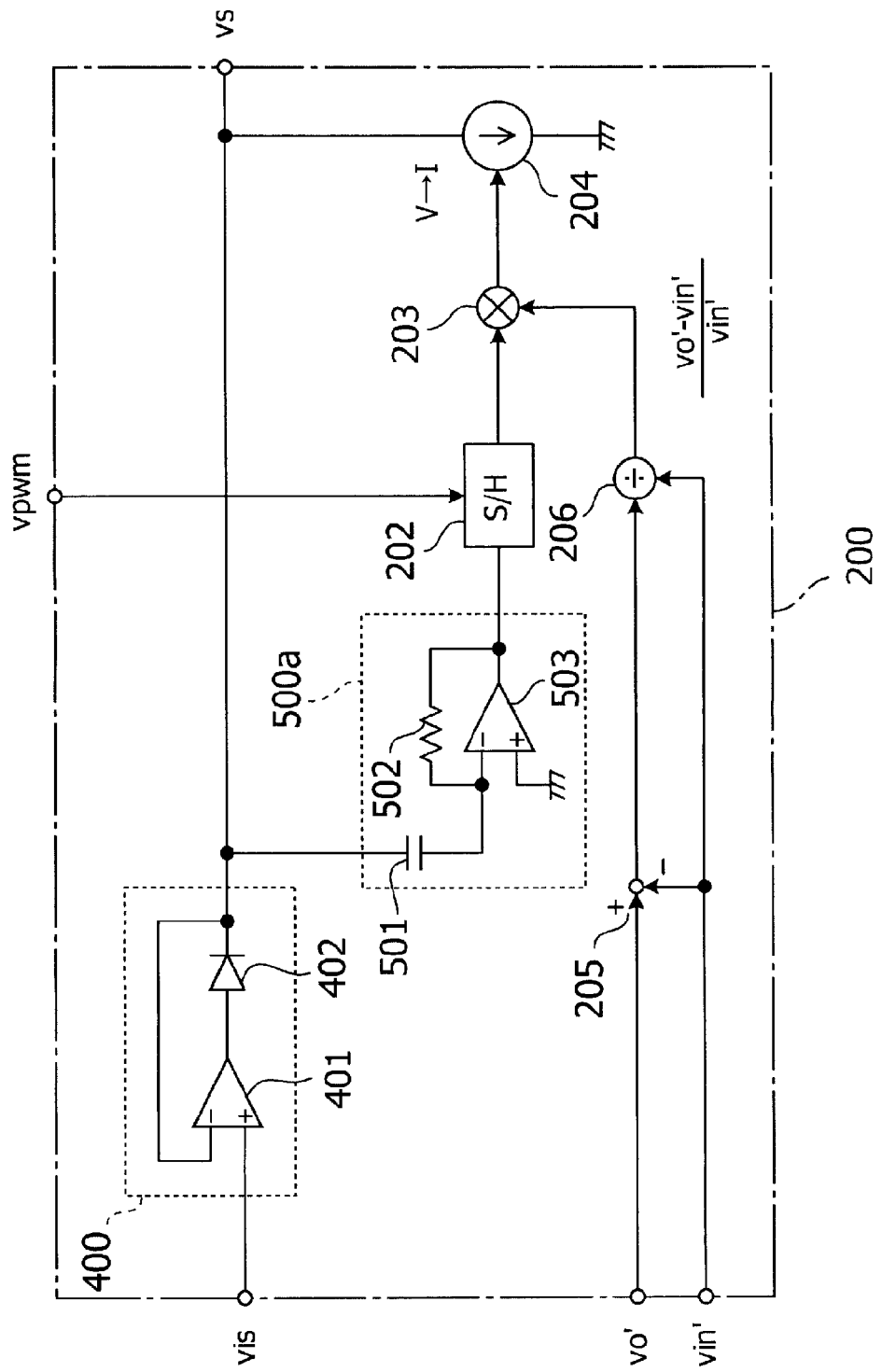
FIG. 5 is a circuit diagram showing another example of a configuration of the current estimation circuit.

FIG. 5 shows another example of a configuration of the current estimation circuit 200. By using a differentiating circuit 500a with the configuration shown, the capacitor 201 shown in FIG. 3 is omitted from the current estimation circuit 200.

The differentiating circuit 500a has a heretofore known configuration including an input capacitor 501, a feedback resistor 502, and an operational amplifier 503, wherein the input capacitor 501 is also utilized as alternative means to the capacitor 201. One end of the input capacitor 501 is connected to an inverting input terminal of the operational amplifier 503, a ground potential, which is a reference potential, is input into a non-inverting input terminal of the operational amplifier 503, and the feedback resistor 502 is connected between the inverting input terminal and an output terminal of the operational amplifier 503.

Herein, assuming that the output voltage vis of the current detector circuit 300 shown in FIG. 1 is rising, the capacitor 501 is charged via the discharge prevention circuit 400 so that the terminal voltage becomes vis (=vs). At this time, a charging current i of the capacitor 501 flows along a path from the discharge prevention circuit 400, through the capacitor 501 and resistor 502, to the output terminal of the operational amplifier 503. Then, taking an electrostatic capacity of the capacitor 501 to be $C_{501}$, a relationship of $(1/C_{501})\int i dt = vs$ is established, so the charging current i of the capacitor 501 corresponds to a differential value of the voltage vis (=vs).

Meanwhile, as the inverting input terminal of the operational amplifier 503 is placed at a ground potential (0 volts) by a virtual short circuit, when taking a resistance value of the feedback resistor 502 to be $R_{502}$, an output voltage −i of the operational amplifier 503 multiplied by $R_{502}$ is also a value proportional to the differential value of the voltage vis (=vs).

The differentiating circuit 500a acts in the way heretofore described. Then, as heretofore described, the inverting terminal of the operational amplifier 503 is placed at a ground potential by a virtual short circuit. Therefore, according to the current estimation circuit 200, as the charging and discharging action of the capacitor 501, which is a component of the differentiating circuit 500a, is the same as that of the capacitor 201, the capacitor 501 also has the function of the capacitor 201, meaning that it is possible to reduce the number of capacitors used.

Figure 6:
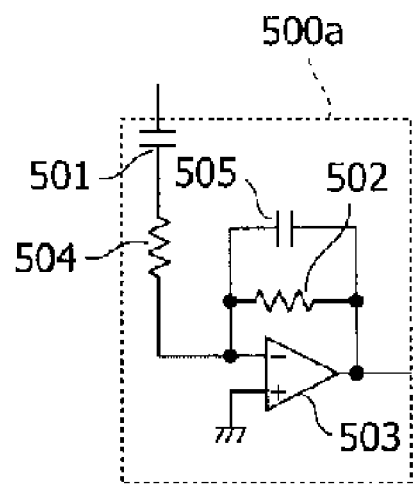
FIG. 6 is a circuit diagram showing another example of a configuration of a differentiating circuit.

A differentiating circuit with the kind of configuration shown in FIG. 6 may be applied in place of the differentiating circuit 500a. The differentiating circuit 500a has a heretofore known configuration wherein an input resistor 504 is connected in series to the capacitor 501 of the differentiating circuit shown in FIG. 5, and a feedback capacitor 505 is connected in parallel to the feedback resistor 502 of the same circuit.

The differentiating circuit 500 provided in the current estimation circuit 200 shown in FIG. 3 can also be given the kinds of configuration shown as examples in FIG. 5 and FIG. 6.

Meanwhile, with the discharge prevention circuit 400 shown in FIG. 3 and FIG. 5, when the capacity value of the capacitors 201 and 501 is low, the capacitors 201 and 501 may be charged or discharged at an on-off timing of the MOSFET 5 (refer to FIG. 1) due to the effect of a joint capacitance or reverse recovery characteristics of the diode 402, in which case, the output voltage vs of the current estimation circuit 200 and the current flowing through the inductor 4 cease to correspond exactly.

Figure 7:
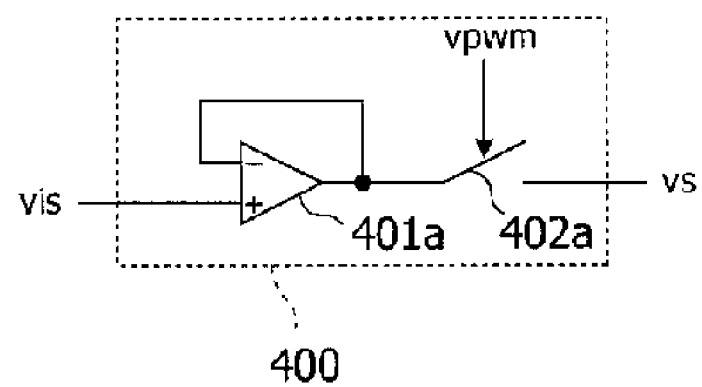
FIG. 7 is a circuit diagram showing another example of a configuration of a discharge prevention circuit.

In order to avoid the heretofore described kind of problem, the discharge prevention circuit 400 shown in FIG. 7 is configured of a voltage follower circuit 401a using an operational amplifier, and a switching circuit 402a connected to an output terminal of the voltage follower circuit 401a.

With this discharge prevention circuit 400, as the switching circuit 402a is controlled using the output signal vpwm of the PWM comparator 110 (refer to FIG. 1), that is, as the switching circuit 402a is turned on at a timing at which the MOSFET 5 is turned on, and the switching circuit 402a is turned off at a timing at which the MOSFET 5 is turned off, the heretofore described problem, wherein the capacitor 201 is charged or discharged due to the effect of the joint capacitance or reverse recovery characteristics of the diode 402, is avoided.

As the switching circuit 402a, it is desirable to choose one with a circuit configuration such that the parasitic capacity thereof is smaller than the capacity of the capacitor 201 or capacitor 501, and furthermore, the charge variation of the capacitor 201 or capacitor 501 accompanying an on-off action thereof is small.

Meanwhile, with the control circuit 100 shown in FIG. 1, a positive and negative power supply is normally used as a control power supply, but it is also possible to use a single power supply as the control power supply in order to achieve a simplification of the power supply configuration. When using a single power supply as the control power supply, it is common that the control reference potential is a biased voltage.

Figure 8:
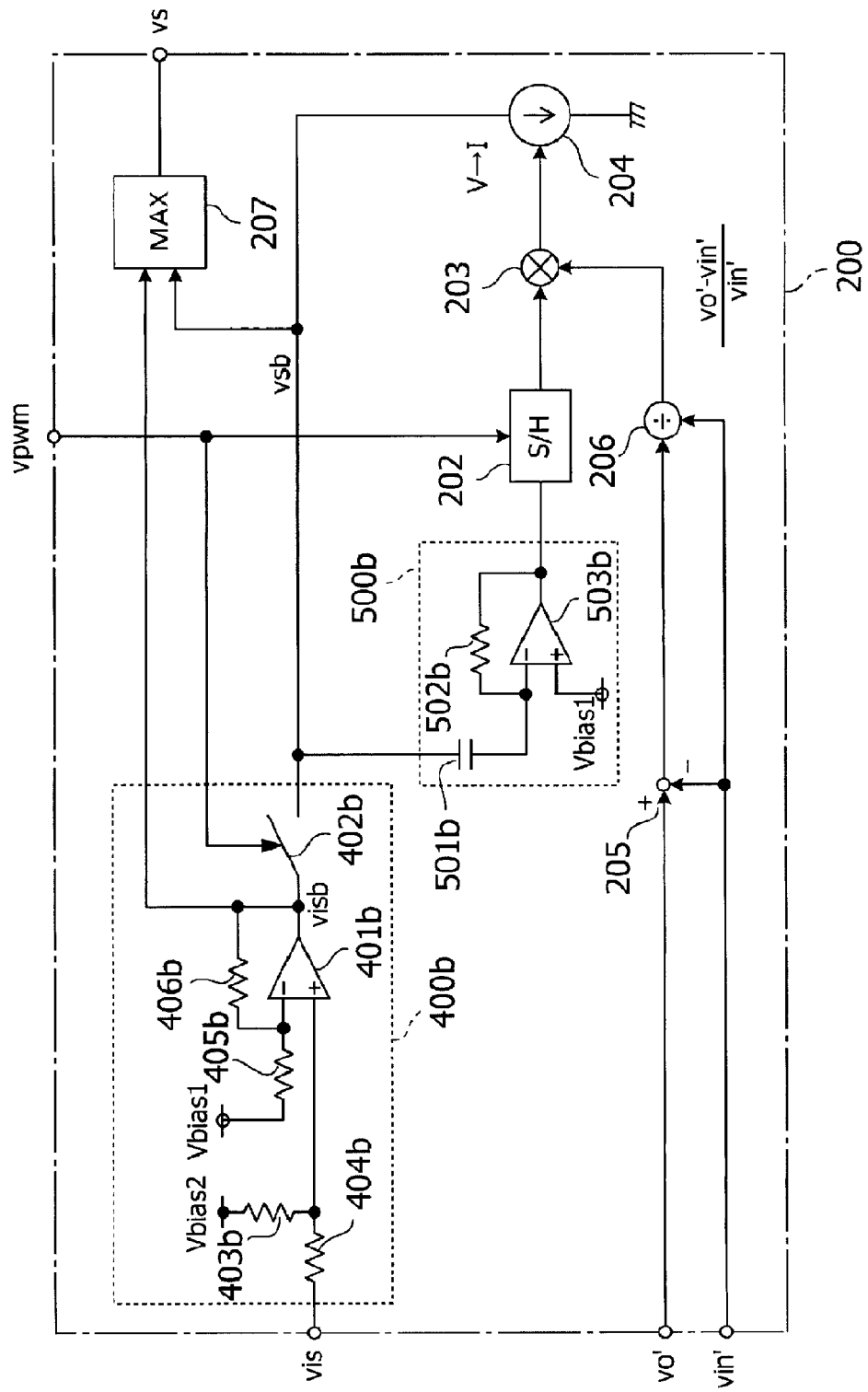
FIG. 8 is a circuit diagram showing another example of a configuration of the current estimation circuit.

FIG. 8 shows an example of a configuration of the current estimation circuit 200 embedded in a control circuit using the heretofore described single power supply. A discharge prevention circuit 400b of the current estimation circuit 200 includes an operational amplifier 401b, a switching circuit 402b connected in series to an output terminal of the operational amplifier 401b, voltage dividing resistors 403b and 404b, one end of each of which is connected to a non-inverting input terminal of the operational amplifier 401b, a resistor 405b, one end of which is connected to an inverting input terminal of the operational amplifier 401b, and a resistor 406b connected between the inverting input terminal and output terminal of the operational amplifier 401b.

In the discharge prevention circuit 400b, a bias voltage Vbias1 is applied via the resistor 405b, and a bias voltage Vbias2 (set to any value larger than that of the bias voltage Vbias1) is applied via the voltage dividing resistor 403b. The voltage vis is input via the voltage dividing resistor 404b.

Meanwhile, although a differentiating circuit 500b of the current estimation circuit 200 has a configuration equivalent to that of the differentiating circuit 500a shown in FIG. 5, the bias voltage Vbias1 is applied as a reference potential to a non-inverting input terminal of an operational amplifier 503b. Also, a feedback resistor 502b corresponding to the feedback resistor 502 of FIG. 5 is connected between an inverting input terminal and output terminal of the operational amplifier 503b.

The divided voltage ratios of the voltage dividing resistors 403b and 404b are adjusted so that the voltage of the non-inverting input terminal of the operational amplifier 401b is Vbias1 when the output voltage vis of the current detector circuit 300 shown in FIG. 1 is zero, because of which, an output voltage visb of the operational amplifier 401b is zero when the signal value vis is zero.

A maximum value circuit 207 compares a terminal voltage vsb of a capacitor 501b and the output voltage visb of the operational amplifier 401b, outputs vsb as the voltage vs indicating the inductor current when vsb≥visb, and outputs visb as the voltage vs indicating the inductor current when vsb<visb.

Figure 9A:
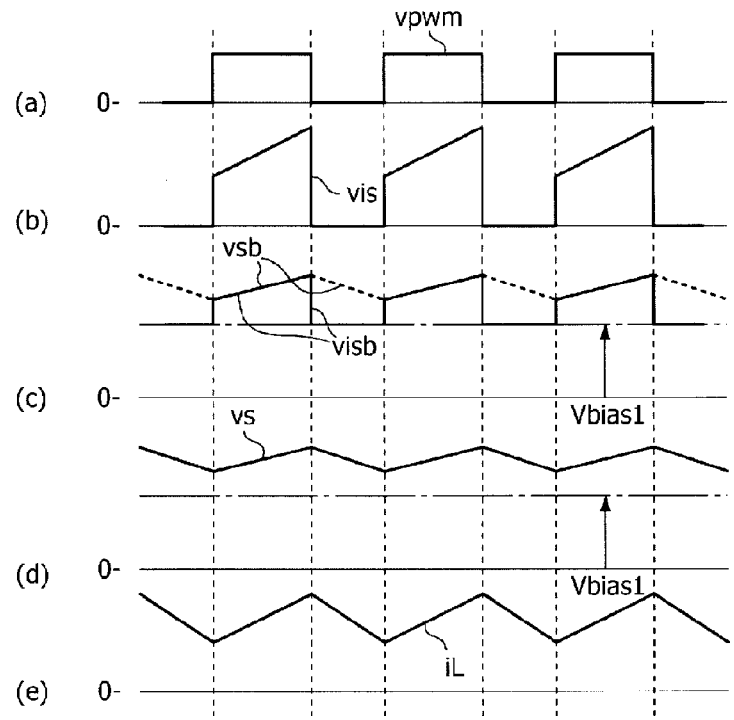
FIG. 9 (A) shows a waveform diagram for illustrating an action of the current estimation circuit of FIG. 8 in a continuous mode, while (B) shows a waveform diagram for illustrating an action of the same circuit in an intermittent mode.
Figure 9B:
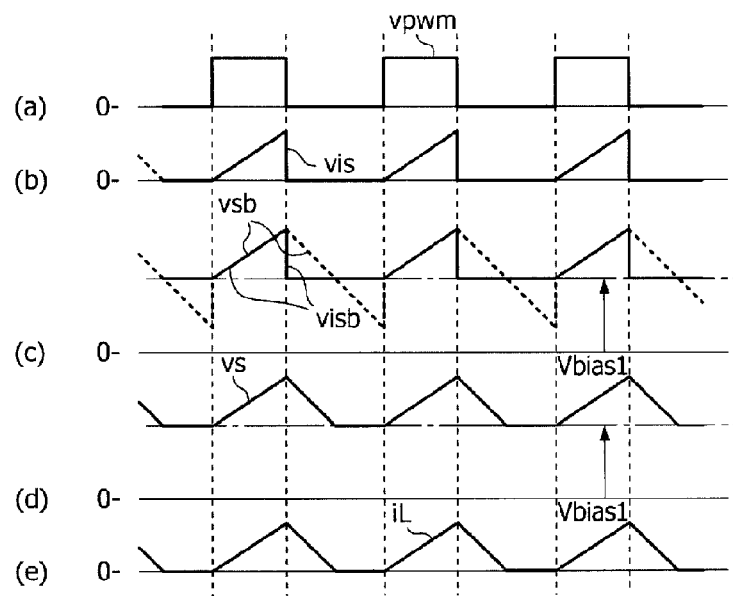
Figure 10:
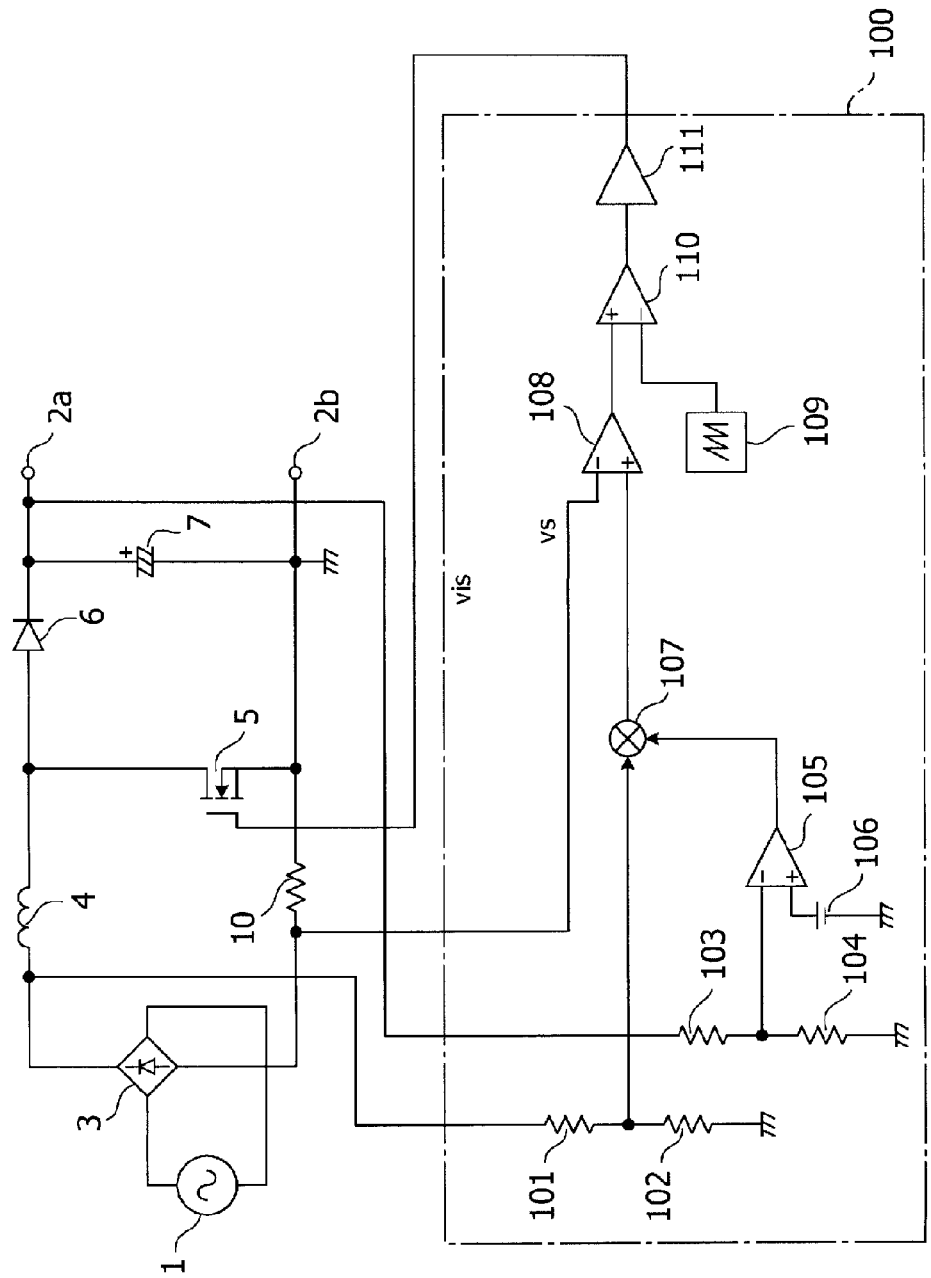
FIG. 10 is a circuit diagram showing a first heretofore known example.

FIG. 9(A) shows a waveform diagram for illustrating an action of the current estimation circuit 200 shown in FIG. 8 in a continuous mode (a mode in which the inductor current does not return to zero every switching cycle), while FIG. 9(B) shows a waveform diagram for illustrating an action of the same circuit 200 in an intermittent mode (a mode in which the inductor current returns to zero every switching cycle). In FIG. 9, the reference characters vsb indicate the terminal voltage of the capacitor 501b. When the switching circuit 402b is turned on, the voltage vsb naturally coincides with the output voltage visb of the operational amplifier 401b.

As shown in FIG. 9, the voltages vsb, visb, and vs vary with the bias voltage Vbias1 as a reference potential.

Herein, an explanation will be given of the reason for providing the maximum value circuit 207. When using the discharge prevention circuit 400b including the switching circuit 402b, the following kind of condition occurs. That is, as shown in the waveform diagram of FIG. 9(B), the inductor current iL becomes zero in an off period of the MOSFET 5 in the intermittent mode. At this time, as the switching circuit 402b is off, the terminal voltage vsb of the capacitor 501b becomes smaller than the voltage visb (the voltage visb when the switching circuit 402b is off is equivalent to the bias voltage Vbias1) on the input side of the switching circuit 402b, as shown in (c) of the diagram.

When seeking to estimate the inductor current from the terminal voltage vsb, the inductor current is estimated to be an apparent negative current in the heretofore described kind of condition. The maximum value circuit 207, as heretofore described, outputs visb as the voltage vs indicating the inductor current when vsb<visb. Consequently, by providing the maximum value circuit 207, it is possible to avoid the heretofore described kind of problem wherein the inductor current is estimated to be a negative current.

The heretofore described configuration using a single power supply can also be applied to the current estimation circuit 200 shown in FIG. 3 and FIG. 5. In this case, it is possible to take the diode 402 to be a switching circuit.

Also, as is clear from FIG. 9(A) and FIG. 9(B), it is also possible to replace the bias voltage Vbias1 with the voltage visb as the reference voltage when the voltage vis from the current detector circuit 300 is zero, and adopt it as one input signal of the maximum value circuit 207.

Also, in the embodiment, an alternating current voltage from an alternating current power supply 1 is used as an input voltage of the invention, and this, full-wave rectified, is used as an input into the switching power supply device but, not being limited to this, a direct current voltage of a direct current power supply of a battery, or the like, may also be used as the input voltage of the invention. In this case, the embodiment is a switching power supply device that is not a power factor correction circuit.

Furthermore, in the embodiment, a booster circuit is taken as an example but, the thinking behind the invention not being limited to this, the invention can also be applied to a step-down circuit, a polarity reversing circuit, or the like.

DESCRIPTION OF REFERENCE NUMERALS AND SIGNS

1 Alternating current power supply
2a, 2b Direct current output terminal
3 Full wave rectifier
4 Inductor
5 MOSFET
6 Diode
7 Smoothing capacitor
8, 8a ACCT
100 Control circuit
101, 102, 103, 104 Resistor
105 Voltage error amplifier 106 Reference voltage
107 Multiplier
108 Current error amplifier
109 Carrier signal
110 PWM comparator
111 Gate driver
200 Current estimation circuit
201 Capacitor
202 Sample and hold circuit
203 Multiplier
204 Voltage control current source
205 Subtractor
206 Divider
207 Maximum value circuit
300 Current detector circuit
400, 400b Discharge prevention circuit
401, 401b Operational amplifier
401a Voltage follower circuit
402 Diode
402a, 402b Switching circuit
403b, 404b, 405b, 406b Resistor
500, 500a, 500b Differentiating circuit
501, 501b, 505 Capacitor
502, 502b, 504 Resistor
503, 503b Operational amplifier

The invention claimed is:

1. A current estimation circuit for estimating a current flowing thorough an inductor in a switching power supply device that converts an alternating current or direct current input voltage into a direct current output voltage utilizing an energy accumulation and releasing action of the inductor accompanying a turning on and off of a switching element, said current estimation circuit comprising:
 current detection means for detecting a current flowing through the switching element, and outputting a corresponding signal voltage;
 a capacitor that is charged by the signal voltage from the current detection means;
 means for determining an amplification factor of a terminal voltage of the capacitor;
 instantaneous value detection means for detecting an absolute value of an instantaneous value of the input voltage and an instantaneous value of the direct current output voltage;
 means for determining a reduction factor of the terminal voltage of the capacitor in an off period of the switching element, based on the amplification factor of the terminal voltage of the capacitor, the absolute value of the instantaneous value of the input voltage, and the instantaneous value of the direct current output voltage; and
 discharging means for discharging the capacitor so that the terminal voltage of the capacitor decreases in accordance with the reduction factor in an off period of the switching element,
 wherein the current flowing through the inductor is estimated from the terminal voltage of the capacitor.

2. The current estimation circuit according to claim 1, wherein the current detection means includes a current transformer.

3. The current estimation circuit according to claim 2, wherein the current transformer is an AC current transformer.

4. The current estimation circuit according to claim 1, further comprising a discharge prevention circuit that prevents a discharge of current from the capacitor to the current detection means.

5. The current estimation circuit according to claim 4, wherein the discharge prevention circuit includes a diode that prevents the discharge of current.

6. The current estimation circuit according to claim 4, wherein the discharge prevention circuit includes a switching circuit that is turned on and off at a timing at which the switching element is turned on and off.

7. The current estimation circuit according to claim 1, wherein the means for determining the amplification factor of the terminal voltage of the capacitor comprises a differentiating circuit.

8. The current estimation circuit according to claim 7, wherein the differentiating circuit has a configuration that uses the capacitor as a differential determining component.

9. The current estimation circuit according to claim 8, wherein the differentiating circuit comprises an operational amplifier having an inverting input terminal and a non-inverting input terminal, one end of the capacitor being connected to the inverting input terminal and a reference potential being input to the non-inverting input terminal, the differentiating circuit further comprising a resistor that is connected between the inverting input terminal and an output terminal of the operational amplifier.

10. The current estimation circuit according to claim 1, further comprising voltage selection means for selecting whichever of the signal voltage from the current detection means and the terminal voltage of the capacitor is the higher voltage as a voltage that estimates the current flowing through the inductor.

11. The current estimation circuit according to claim 1, further comprising voltage selection means for selecting whichever of a corresponding reference voltage when the signal voltage from the current detection means is zero and the terminal voltage of the capacitor is the higher voltage as a voltage that estimates the current flowing through the inductor.

12. The current estimation circuit according to claim 1, wherein the reduction factor of the terminal voltage of the capacitor is obtained by determining $(+di/dt)\cdot(vo-vin)/vin$, where $di/dt$ is the amplification factor of the terminal voltage of the capacitor, $vin$ is the absolute value of the instantaneous value of the input voltage, and $vo$ is the instantaneous value of the direct current output voltage.

* * * * *